(12) United States Patent
Ma et al.

(10) Patent No.: US 10,950,324 B2
(45) Date of Patent: Mar. 16, 2021

(54) SHIFT REGISTER UNIT, SHIFT REGISTER, GATE DRIVING CIRCUIT AND DISPLAY PANEL

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Mingchao Ma, Beijing (CN); Jun Fan, Beijing (CN); Yue Shan, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 523 days.

(21) Appl. No.: 15/776,980

(22) PCT Filed: Sep. 21, 2017

(86) PCT No.: PCT/CN2017/102683
§ 371 (c)(1),
(2) Date: May 17, 2018

(87) PCT Pub. No.: WO2018/153077
PCT Pub. Date: Aug. 30, 2018

(65) Prior Publication Data
US 2020/0327949 A1    Oct. 15, 2020

(30) Foreign Application Priority Data
Feb. 24, 2017 (CN) .......................... 2017 1 0104497

(51) Int. Cl.
*G11C 27/04* (2006.01)
*G09G 5/00* (2006.01)

(52) U.S. Cl.
CPC ............... *G11C 27/04* (2013.01); *G09G 5/00* (2013.01); *G09G 2310/0286* (2013.01); *G09G 2310/06* (2013.01)

(58) Field of Classification Search
CPC combination set(s) only.
See application file for complete search history.

(56) References Cited

U.S. PATENT DOCUMENTS 9,071,230 B2    6/2015 Kim et al.
9,502,135 B2   11/2016 Zeng et al.
(Continued)

FOREIGN PATENT DOCUMENTS

CN    101335050 A    12/2008
CN    101527109 A     9/2009
(Continued)

OTHER PUBLICATIONS

International Search Report dated Dec. 25, 2017 in corresponding International Application No. PCT/CN2017/102683 along with an English translation of the International Search Report and an English translation of the Written Opinion of the International Searching Authority.

(Continued)

*Primary Examiner* — Robin J Mishler
(74) *Attorney, Agent, or Firm* — Nath, Goldberg & Meyer; Joshua B. Goldberg

(57) ABSTRACT

The present disclosure provides a shift register unit whose operating time includes a plurality of multi-frame periods, each of the multi-frame periods including a plurality of frame periods. The shift register unit includes a trigger signal input terminal, an input module, a pull-up module, a pull-down control module, a plurality of pull-down modules, and a signal output terminal. The pull-down control module is configured to sequentially provide active signals (Continued)

to the control terminals of respective pull-down modules in pull-down stages of respective frame periods of one multi-frame period. The present disclosure further provides a shift register, a gate driving circuit and a display panel. The shift register unit has longer lifetime and better electric performance, and can meet the requirements of high-reliability products.

19 Claims, 5 Drawing Sheets

(56) References Cited

U.S. PATENT DOCUMENTS

| | | | |
|---|---|---|---|
| 2014/0086379 A1* | 3/2014 | Ma | ............................ H03K 5/00 377/64 |
| 2016/0293091 A1 | 10/2016 | Wang | |
| 2018/0181227 A1* | 6/2018 | Huang | ................. G06F 3/04166 |

FOREIGN PATENT DOCUMENTS

| | | |
|---|---|---|
| CN | 102654986 A | 9/2012 |
| CN | 202502720 U | 10/2012 |
| CN | 103137061 A | 6/2013 |
| CN | 103198781 A | 7/2013 |
| CN | 103226979 A | 7/2013 |
| CN | 104361852 A | 2/2015 |
| CN | 104361869 A | 2/2015 |
| CN | 105609041 A | 5/2016 |
| CN | 106601179 A | 4/2017 |
| KR | 10-2006-0129881 A | 12/2006 |
| KR | 10-2007-0003564 A | 1/2007 |

OTHER PUBLICATIONS

Office Action dated Mar. 19, 2019 issued in corresponding Chinese Application No. 201710104497.5.

* cited by examiner

SHIFT REGISTER UNIT, SHIFT REGISTER, GATE DRIVING CIRCUIT AND DISPLAY PANEL

This is a National Phase Application filed under 35 U.S.C. 371 as a national stage of PCT/CN2017/102683, filed Sep. 21, 2017, an application claiming the benefit of Chinese Application No. 201710104497.5, filed Feb. 24, 2017, the content of each of which is hereby incorporated by reference in its entirety.

TECHNICAL FIELD

The present disclosure relates to the field of display technologies, and in particular, to a shift register unit, a shift register including the shift register unit, a gate driving circuit including the shift register, and a display panel including the gate driving circuit.

BACKGROUND

In order to reduce a size of a bezel of a display device, shift registers of a gate driving circuit are generally integrated on an array substrate. The shift register includes cascaded multiple stages of shift register units. Typically, each shift register unit includes a plurality of transistors. As the functions of the display device become more and more powerful, people use the display device for a longer time.

SUMMARY

The present disclosure provides a shift register unit, a shift register including the shift register unit, a gate driving circuit including the shift register, and a display panel including the gate driving circuit.

As an aspect of the present disclosure, there is provided a shift register unit whose operating time includes a plurality of multi-frame periods, each of the multi-frame periods including a plurality of frame periods and each of the frame periods including at least one operating cycle. The shift register unit includes a trigger signal input terminal, an input circuit, a pull-up circuit, a pull-down control circuit, a plurality of pull-down circuits, and a signal output terminal, the trigger signal input terminal is electrically connected to a control terminal of the input circuit, and configured to provide an active signal to the control terminal of the input circuit in an input stage of the shift register unit;

an output terminal of the input circuit is electrically connected to a control terminal of the pull-up circuit, and the input circuit is configured to provide an active signal to the control terminal of the pull-up circuit when the control terminal of the input circuit receives an active signal;

an input terminal of the pull-up circuit is electrically connected to an initial signal terminal, an output terminal of the pull-up circuit is electrically connected to the signal output terminal, and the pull-up circuit is configured to electrically connect the input terminal of the pull-up circuit to the output terminal of the pull-up circuit when the control terminal of the pull-up circuit receives an active signal;

an input terminal of each of the pull-down circuits is electrically connected to a second level signal terminal, a first output terminal of each of the pull-down circuits is electrically connected to the signal output terminal, a second output terminal of each of the pull-down circuits is electrically connected to the control terminal of the pull-up circuit, and each pull-down circuit is configured to electrically connect an input terminal of the pull-down circuit to the first and second output terminals of the pull-down circuit when a control terminal of the pull-down circuit receives an active signal; and the pull-down control circuit includes a plurality of pull-down control signal output terminals electrically connected to the control terminals of the pull-down circuits, respectively, and is configured to sequentially provide active signals to the control terminals of respective pull-down circuits in pull-down stages of respective frame periods of one multi-frame period, such that the pull-down circuits are turned on in different frame periods, respectively.

Optionally, each of the multi-frame periods includes odd frame periods and even frame periods that alternate with each other, and the pull-down circuits include an odd frame pull-down circuit and an even frame pull-down circuit, the pull-down control circuit is configured to output an active signal to a control terminal of the odd frame pull-down circuit and output an inactive signal to a control terminal of the even frame pull-down circuit in a pull-down stage of each odd frame period, and the pull-down control circuit is configured to output an active signal to the control terminal of the even frame pull-down circuit and output an inactive signal to the control terminal of the odd frame pull-down circuit in a pull-down stage of each even frame period.

Optionally, the pull-down control circuit includes a pull-down control sub-circuit, an odd frame trigger sub-circuit and an even frame trigger sub-circuit, a first output terminal of the odd frame trigger sub-circuit and a second output terminal of the even frame pull-down circuit are electrically connected to each other to serve as a first output terminal of the pull-down control circuit, and a second output terminal of the odd frame pull-down circuit and a first output terminal of the even frame trigger sub-circuit are electrically connected to each other to serve as a second output terminal of the pull-down control circuit;

the shift register unit further includes a first frame type signal input terminal and a second frame type signal input terminal, the pull-down control sub-circuit is configured to output an active signal in the pull-down stage of each frame period;

a control terminal of the odd frame trigger sub-circuit is electrically connected to the first frame type signal input terminal, a first input terminal of the odd frame trigger sub-circuit is electrically connected to an output terminal of the pull-down control sub-circuit, a second input terminal of the odd frame trigger sub-circuit is electrically connected to the second level signal terminal, the first output terminal of the odd frame trigger sub-circuit is electrically connected to the control terminal of the even frame pull-down circuit, the second output terminal of the odd frame trigger sub-circuit is electrically connected to the control terminal of the odd frame pull-down circuit, and the odd frame trigger sub-circuit is configured to electrically connect the second input terminal of the odd frame trigger sub-circuit to the first output terminal of the odd frame trigger sub-circuit and electrically connect the first input terminal of the odd frame trigger sub-circuit to the second output terminal of the odd frame trigger sub-circuit when the control terminal of the odd frame trigger sub-circuit receives an active signal; and a control terminal of the even frame trigger sub-circuit is electrically connected to the second frame type signal input terminal, a first input terminal of the even frame trigger sub-circuit is electrically connected to the output terminal of the pull-down control sub-circuit, a second input terminal of the even frame trigger sub-circuit is electrically connected to the second level signal terminal, the first output terminal of the even frame trigger sub-circuit is electrically connected to the control terminal of the odd frame pull-down circuit, the second output terminal of the even frame trigger sub-circuit is electrically connected to the control terminal of the even frame pull-down circuit, and the even frame trigger sub-circuit is configured to electrically connect the second input terminal of the even frame trigger sub-circuit to the first output terminal of the even frame trigger sub-circuit and electrically connect the first input terminal of the even frame trigger sub-circuit to the second output terminal of the even frame trigger sub-circuit when the control terminal of the even frame trigger sub-circuit receives an active signal.

Optionally, the odd frame trigger sub-circuit includes a first odd frame trigger transistor and a second odd frame trigger transistor, a gate electrode of the first odd frame trigger transistor is electrically connected to the first frame type signal input terminal, a first electrode of the first odd frame trigger transistor is electrically connected to the first input terminal of the odd frame trigger sub-circuit, and a second electrode of the first odd frame trigger transistor is electrically connected to the second output terminal of the odd frame trigger sub-circuit; and a gate electrode of the second odd frame trigger transistor is electrically connected to the first frame type signal input terminal, a first electrode of the second odd frame trigger transistor is electrically connected to the second level signal terminal, and a second electrode of the second odd frame trigger transistor is electrically connected to the first output terminal of the odd frame trigger sub-circuit.

Optionally, the even frame trigger sub-circuit includes a first even frame trigger transistor and a second even frame trigger transistor, a gate electrode of the first even frame trigger transistor is electrically connected to the second frame type signal input terminal, a first electrode of the first even frame trigger transistor is electrically connected to the first input terminal of the even frame trigger sub-circuit, and a second electrode of the first even frame trigger transistor is electrically connected to the second output terminal of the even frame trigger sub-circuit; and a gate electrode of the second even frame trigger transistor is electrically connected to the second frame type signal input terminal, a first electrode of the second even frame trigger transistor is electrically connected to the second level signal terminal, and a second electrode of the second even frame trigger transistor is electrically connected to the first output terminal of the even frame trigger sub-circuit.

Optionally, the odd frame pull-down circuit includes a first odd frame pull-down transistor, a second odd frame pull-down transistor, and a third odd frame pull-down transistor;

a gate electrode of the first odd frame pull-down transistor is electrically connected to the control terminal of the odd frame pull-down circuit, a first electrode of the first odd frame pull-down transistor is electrically connected to the signal output terminal, and a second electrode of the first odd frame pull-down transistor is electrically connected to the second level signal terminal;

a first electrode of the second odd frame pull-down transistor is electrically connected to the control terminal of the pull-up circuit, a second electrode of the second odd frame pull-down transistor is electrically connected to the second level signal terminal, and a gate electrode of the second odd frame pull-down transistor is electrically connected to the control terminal of the odd frame pull-down circuit; and a gate electrode of the third odd frame pull-down transistor is electrically connected to the control terminal of the pull-up circuit, a first electrode of the third odd frame pull-down transistor is electrically connected to the control terminal of the odd frame pull-down circuit, and a second electrode of the third odd frame pull-down transistor is electrically connected to the second level signal terminal.

Optionally, the odd frame pull-down circuit further includes a first storage capacitor, a first end of the first storage capacitor is electrically connected to the control terminal of the odd frame pull-down circuit, and a second end of the first storage capacitor is electrically connected to the second level signal terminal.

Optionally, the even frame pull-down circuit includes a first even frame pull-down transistor, a second even frame pull-down transistor, and a third even frame pull-down transistor, a gate electrode of the first even frame pull-down transistor is electrically connected to the control terminal of the even frame pull-down circuit, a first electrode of the first even frame pull-down transistor is electrically connected to the signal output terminal, and a second electrode of the first even frame pull-down transistor is electrically connected to the second level signal terminal;

a gate electrode of the second even frame pull-down transistor is electrically connected to the control terminal of the even frame pull-down circuit, a first electrode of the second even frame pull-down transistor is electrically connected to the control terminal of the pull-up circuit, and a second electrode of the second even frame pull-down transistor is electrically connected to the second level signal terminal; and a gate electrode of the third even frame pull-down transistor is electrically connected to the control terminal of the pull-up circuit, a first electrode of the third even frame pull-down transistor is electrically connected to the second level signal terminal, and a second electrode of the third even frame pull-down transistor is electrically connected to the control terminal of the even frame pull-down circuit.

Optionally, the even frame pull-down circuit further includes a second storage capacitor, a first end of the second storage capacitor is electrically connected to the control terminal of the even frame pull-down circuit, and a second end of the second storage capacitor is electrically connected to the second level signal terminal.

Optionally, the input circuit includes a forward input circuit and an inverse input circuit, the shift register unit includes a forward signal terminal and an inverse signal terminal, the trigger signal input terminal includes a forward trigger signal input terminal and an inverse trigger signal input terminal, the pull-down control sub-circuit includes a forward pull-down control sub-circuit and an inverse pull-down control sub-circuit, a control terminal of the forward input circuit is electrically connected to the forward trigger signal input terminal, an input terminal of the forward input circuit is electrically connected to the forward signal terminal, and an output terminal of the forward input circuit is electrically connected to the output terminal of the input circuit;

a control terminal of the inverse input circuit is electrically connected to the inverse trigger signal input terminal, an input terminal of the inverse input circuit is electrically connected to the inverse signal terminal, and an output terminal of the inverse input circuit is electrically connected to the control terminal of the pull-up circuit;

a control terminal of the forward pull-down control sub-circuit is electrically connected to the forward signal terminal, an input terminal of the forward pull-down control sub-circuit is electrically connected to a second clock signal terminal, and an output terminal of the forward pull-down control sub-circuit is electrically connected to an output terminal of the inverse pull-down control sub-circuit, and electrically connected to the first input terminal of the odd frame trigger sub-circuit and the first input terminal of the even frame trigger sub-circuit; and a control terminal of the inverse pull-down control sub-circuit is electrically connected to the inverse signal terminal, an input terminal of the inverse pull-down control sub-circuit is electrically connected to a fourth clock signal terminal, and the output terminal of the inverse pull-down control sub-circuit is electrically connected to the output terminal of the forward pull-down control sub-circuit.

Optionally, the forward input circuit is configured to electrically connect the input terminal of the forward input circuit to the output terminal of the forward input circuit when the control terminal of the forward input circuit receives an active signal;

the inverse input circuit is configured to electrically connect the input terminal of the inverse input circuit to the output terminal of the inverse input circuit when the control terminal of the inverse input circuit receives an active signal;

the forward pull-down control sub-circuit is configured to output an active signal provided by the forward signal terminal when the forward signal terminal provides the active signal and the inverse signal terminal provides an inactive signal; and the inverse pull-down control sub-circuit is configured to output an active signal provided by the inverse signal terminal when the forward signal terminal provides an inactive signal and the inverse signal terminal provides the active signal.

Optionally, the forward input circuit includes a forward input transistor, a gate electrode of the forward input transistor is electrically connected to the control terminal of the forward input circuit, a first electrode of the forward input transistor is electrically connected to the input terminal of the forward input circuit, and a second electrode of the forward input transistor is electrically connected to the output terminal of the forward input circuit.

Optionally, the inverse input circuit includes an inverse input transistor, a gate electrode of the inverse input transistor is electrically connected to the control terminal of the inverse input circuit, a first electrode of the inverse input transistor is electrically connected to the input terminal of the inverse input circuit, and a second electrode of the inverse input transistor is electrically connected to the output terminal of the inverse input circuit.

Optionally, the forward pull-down control sub-circuit includes a first forward pull-down control transistor and a second forward pull-down control transistor, a gate electrode of the first forward pull-down control transistor is electrically connected to the control terminal of the forward pull-down control sub-circuit, a first electrode of the first forward pull-down control transistor is electrically connected to the second clock signal terminal, and a second electrode of the first forward pull-down control transistor is electrically connected to a gate electrode of the second forward pull-down control transistor; and a first electrode of the second forward pull-down control transistor is electrically connected to the second clock signal terminal, and a second electrode of the second forward pull-down control transistor is electrically connected to the output terminal of the forward pull-down control sub-circuit.

Optionally, the inverse pull-down control sub-circuit includes a first inverse pull-down control transistor and a second inverse pull-down control transistor, a gate electrode of the first inverse pull-down control transistor is electrically connected to the inverse signal terminal, a first electrode of the first inverse pull-down control transistor is electrically connected to the fourth clock signal terminal, and a second electrode of the first inverse pull-down control transistor is electrically connected to a gate electrode of the second inverse pull-down control transistor; and a first electrode of the second inverse pull-down control transistor is electrically connected to the fourth clock signal terminal, and a second electrode of the second inverse pull-down control transistor is electrically connected to the output terminal of the inverse pull-down control sub-circuit.

Optionally, the pull-up circuit includes a pull-up transistor and a third storage capacitor, and the initial signal terminal includes a first clock signal terminal, a gate electrode of the pull-up transistor is electrically connected to a control terminal of the pull-up circuit, a first electrode of the pull-up transistor is electrically connected to the first clock signal terminal, and a second electrode of the pull-up transistor is electrically connected to the signal output terminal; and a first end of the third storage capacitor is electrically connected to the gate electrode of the pull-up transistor, and a second end of the third storage capacitor is electrically connected to the signal output terminal.

As a second aspect of the present disclosure, there is provided a shift register including a plurality of cascaded shift register units, wherein each of the plurality of shift register units is the aforementioned shift register unit according to the present disclosure.

As a third aspect of the present disclosure, there is provided a gate driving circuit, wherein the gate driving circuit includes a shift register and a frame signal determination unit, the shift register being the aforementioned shift register according to the present disclosure, and the frame signal determination unit being configured to output a frame trigger signal indicating a sequence number of a frame to the shift register unit.

As a fourth aspect of the present disclosure, there is provided a display panel including a gate driving circuit, wherein the gate driving circuit is the aforementioned gate driving circuit according to the present disclosure.

BRIEF DESCRIPTION OF DRAWINGS

The drawings are intended to provide a further understanding of the present disclosure and constitute a part of the specification to explain the present disclosure together with the following detailed description, but not to be construed as limiting the present disclosure. In the drawings.

DETAILED DESCRIPTION

The present disclosure will be described in detail below in conjunction with the accompanying drawings. It should be noted that embodiments described herein are merely intended to be illustrative and explanatory but not to be construed as limiting the present disclosure.

Figure 1:
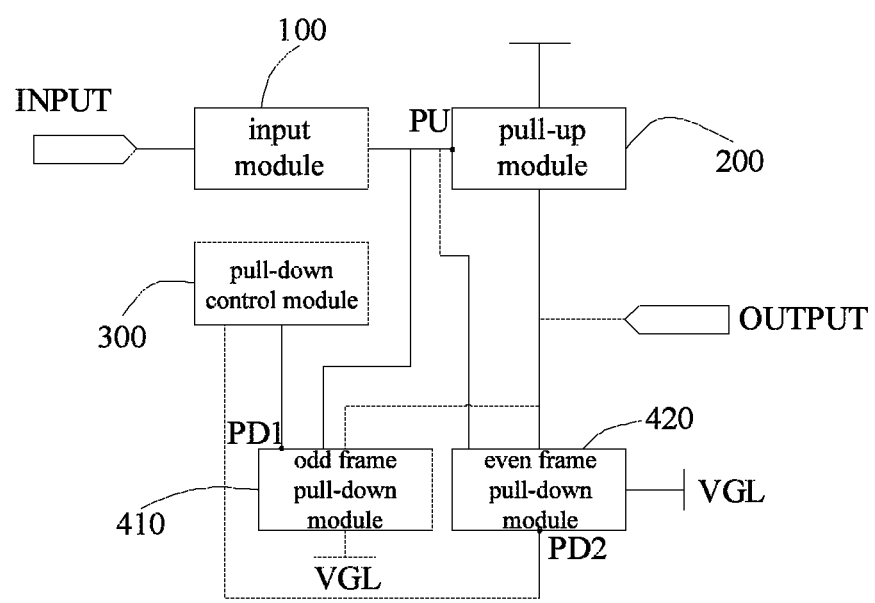
FIG. 1 is a block schematic diagram of a shift register unit according to an embodiment of the present disclosure.

As an aspect of the present disclosure, there is provided a shift register unit whose operating time includes a plurality of multi-frame periods, each of the multi-frame periods including a plurality of frame periods. As illustrated in FIG. 1, the shift register unit includes a trigger signal input terminal INPUT, an input circuit 100, a pull-up circuit 200, a pull-down control circuit 300, a plurality of pull-down circuits, and a signal output terminal OUTPUT.

The trigger signal input terminal INPUT is electrically connected to a control terminal of the input circuit 100, and the trigger signal input terminal INPUT can provide an active signal to the control terminal of the input circuit during an input stage of the shift register unit.

An output terminal of the input circuit 100 is electrically connected to a control terminal PU of the pull-up circuit 200, and the input circuit 100 can provide an active signal to the control terminal PU of the pull-up circuit 200 when the control terminal of the input circuit 100 receives an active signal.

An input terminal of the pull-up circuit 200 is electrically connected to an initial signal terminal, an output terminal of the pull-up circuit 200 is electrically connected to the signal output terminal OUTPUT, and the pull-up circuit 200 can electrically connect the input terminal of the pull-up circuit 200 and the output terminal of the pull-up circuit 200 when the control terminal PU of the pull-up circuit 200 receives an active signal.

An input terminal of each of the pull-down circuits is electrically connected to a second level signal terminal VGL, a first output terminal of each of the pull-down circuits is electrically connected to the signal output terminal OUTPUT, a second output terminal of each of the pull-down circuits is electrically connected to the control terminal PU of the pull-up circuit 200, and for each pull-down circuit, an input terminal of the pull-down circuit is electrically connected to each output terminal of the pull-down circuit when a control terminal of the pull-down circuit receives an active signal. When the input terminal of the pull-down circuit is electrically connected to each output terminal of the pull-down circuit, the second level signal terminal VGL is electrically connected to the signal output terminal OUTPUT and the control terminal PU of the pull-up circuit 200, respectively, to discharge the signal output terminal OUTPUT and the control terminal PU of the pull-up circuit 200 through the second level signal terminal VGL.

The pull-down control circuit 300 includes a plurality of pull-down control signal output terminals electrically connected to the control terminals of the pull-down circuits, respectively, and the pull-down control circuit 300 can sequentially provide active signals to the control terminals of respective pull-down circuits in pull-down stages of respective frame periods of one multi-frame period, such that the pull-down circuits are turned on in different frame periods, respectively.

It should be noted that, one multi-frame period of a shift register unit herein is one display phase of a display apparatus including the shift register unit. In each display phase, multiple frames of image are displayed, and accordingly, in each frame period of one multi-frame period of the shift register unit, one of the multiple frames of image is displayed. When scanning signals are provided to a plurality of gate lines of a display panel by using a shift register including the shift register unit(s), the plurality of pull-down circuits work in turn in one multi-frame period. In other words, in one multi-frame period, when one of the pull-down circuits works (e.g., is turned on), the other ones of the pull-down circuits are all in off state. For example, in one frame period, only one of the plurality of pull-down circuits works. As compared with a shift register unit including a single pull-down circuit, the turn-on time of each pull-down circuit in the shift register unit according to the present disclosure is short. Therefore, each pull-down circuit has a longer lifetime and thus the lifetime of the shift register unit is prolonged. In addition, since the turn-on time of each pull-down circuit is short, the pull-down circuit has better electrical performance (for example, each transistor is not easily aged, etc.) and can meet the requirements of high-reliability products.

In the present disclosure, each signal output terminal OUTPUT is electrically connected to a corresponding one of the gate lines in the display panel, that is, the shift register unit provides a scanning signal for a corresponding gate line. One frame period may include at least one operating cycle, and each operating cycle may include an output stage, an input stage, and a pull-down stage. In one example, the number of operating cycles in one frame period may be the same as the number of gate lines in the display panel, but the present disclosure is not limited thereto.

Since the input terminal of the pull-up circuit is electrically connected to the initial signal terminal, the signal output from the signal output terminal OUTPUT is the signal provided by the initial signal terminal in the output stage. In the present disclosure, there is no particular limitation on the specific type and structure of the initial signal terminal. In an embodiment, the initial signal terminal may be the first clock signal terminal CLK1 shown in FIG. 2. In another embodiment, the initial signal terminal may be a power signal output terminal (e.g., a high-level signal terminal VDD). Producers can choose the type of initial signal terminal based on specific requirements.

To simplify the specific structure of the display apparatus, in one example, each of the multi-frame periods includes odd frame periods and even frame periods that alternate with each other, and the pull-down circuit includes an odd frame pull-down circuit 410 and an even frame pull-down circuit 420.

The pull-down control circuit 300 outputs an active signal to a control terminal PD1 of the odd frame pull-down circuit 410 in a pull-down stage of each odd frame period so as to electrically connect the input terminal of the odd frame pull-down circuit and the output terminal of the odd frame pull-down circuit, and meanwhile the pull-down control circuit 300 outputs an inactive signal to a control terminal PD2 of the even frame pull-down circuit 420 so as to control the odd frame pull-down circuit 410 not to work.

The pull-down control circuit 300 outputs an active signal to the control terminal PD2 of the even frame pull-down circuit 420 in a pull-down stage of each even frame period so as to electrically connect the input terminal of the even frame pull-down circuit and the output terminal of the even frame pull-down circuit, and outputs an inactive signal to the control terminal PD1 of the odd frame pull-down circuit 410 so as to control the odd frame pull-down circuit 410 not to work.

By providing both the odd frame pull-down circuit 410 and the even frame pull-down circuit 420 in the shift register unit, the lifetime of the entire shift register unit can be prolonged and the fabricating and manufacturing processes can be facilitated.

In the present disclosure, there is no particular limitation on the specific structure of the pull-down control circuit 300. In an embodiment illustrated in FIG. 2, the pull-down control circuit 300 includes a pull-down control sub-circuit 310, an odd frame trigger sub-circuit 320 and an even frame trigger sub-circuit 330, and accordingly, a first output terminal of the odd frame trigger sub-circuit 320 and a second output terminal of the even frame trigger sub-circuit 330 are electrically connected to each other as a first output terminal of the pull-down control circuit 300, and a second output terminal of the odd frame trigger sub-circuit 320 and a first output terminal of the even frame trigger sub-circuit 330 are electrically connected to each other as a second output terminal of the pull-down control circuit 300.

The shift register unit further includes a first frame type signal input terminal GCH1 and a second frame type signal input terminal GCH2.

The pull-down control sub-circuit 310 can output an active signal in the pull-down stage of each frame period.

A control terminal of the odd frame trigger sub-circuit 320 is electrically connected to the first frame type signal input terminal GCH1, a first input terminal of the odd frame trigger sub-circuit 320 is electrically connected to an output terminal of the pull-down control sub-circuit 310, a second input terminal of the odd frame trigger sub-circuit is electrically connected to the second level signal terminal VGL, a first output terminal of the odd frame trigger sub-circuit is electrically connected to the control terminal PD2 of the even frame pull-down circuit 420, a second output terminal of the odd frame trigger sub-circuit 320 is electrically connected to the control terminal PD1 of the odd frame pull-down circuit 410. The odd frame trigger sub-circuit 320 is configured to electrically connect the second input terminal of the odd frame trigger sub-circuit 320 to the first output terminal of the odd frame trigger sub-circuit 320 and electrically connect the first input terminal of the odd frame trigger sub-circuit 320 to the second output terminal of the odd frame trigger sub-circuit 320 when the control terminal of the odd frame trigger sub-circuit 320 receives an active signal.

A control terminal of the even frame trigger sub-circuit 330 is electrically connected to the second frame type signal input terminal GCH2, a first input terminal of the even frame trigger sub-circuit 330 is electrically connected to the output terminal of the pull-down control sub-circuit 310, a second input terminal of the even frame trigger sub-circuit 330 is electrically connected to the second level signal terminal VGL, a first output terminal of the even frame trigger sub-circuit 330 is electrically connected to the control terminal PD1 of the odd frame pull-down circuit 410, a second output terminal of the even frame trigger sub-circuit 330 is electrically connected to the control terminal PD2 of the even frame pull-down circuit 420. The even frame trigger sub-circuit 330 is configured to electrically connect the second input terminal of the even frame trigger sub-circuit 330 to the first output terminal of the even frame trigger sub-circuit 330 and electrically connect the first input terminal of the even frame trigger sub-circuit 330 to the second output terminal of the even frame trigger sub-circuit 330 when the control terminal of the even frame trigger sub-circuit 330 receives an active signal.

In the odd frame period, the control terminal PD1 of the odd frame pull-down circuit 410 receives an active signal provided by the odd frame trigger sub-circuit 320, and the input terminal of the odd frame pull-down circuit 410 is electrically connected to the first and second output terminals of the odd frame pull-down circuit 410, respectively, to provide a second level signal from the second level signal terminal VGL to the signal output terminal OUTPUT and the control terminal PU of the pull-up circuit, respectively, so that the signal output terminal OUTPUT and the control terminal PU of the pull-up circuit 200 can be discharged.

In the even frame period, the control terminal PD2 of the even frame pull-down circuit 420 receives an active signal provided by the even frame trigger sub-circuit 330, the input terminal of the even frame pull-down circuit 420 is electrically connected to the first and second output terminals of the even frame pull-down circuit 420 to provide the second level signal to the signal output terminal OUTPUT and the control terminal PU of the pull-up circuit, respectively, so that the signal output terminal OUTPUT and the control terminal PU of the pull-up circuit can be discharged.

In the present disclosure, there is no particular limitation on the specific structure of the odd frame trigger sub-circuit. In an embodiment illustrated in FIG. 2, the odd frame trigger sub-circuit 320 includes a first odd frame trigger transistor M14 and a second odd frame trigger transistor M17.

Specifically, a gate electrode of the first odd frame trigger transistor M14 is electrically connected to the first frame type signal input terminal GCH1, a first electrode of the first odd frame trigger transistor M14 is electrically connected to the first input terminal of the odd frame trigger sub-circuit 320, and a second electrode of the first odd frame trigger transistor M14 is electrically connected to the second output terminal of the odd frame trigger sub-circuit 320.

A gate electrode of the second odd frame trigger transistor M17 is electrically connected to the first frame type signal input terminal GCH1, a first electrode of the second odd frame trigger transistor M17 is electrically connected to the second level signal terminal VGL, and a second electrode of the second odd frame trigger transistor M17 is electrically connected to the first output terminal of the odd frame trigger sub-circuit 320.

It should be noted that the type of the first odd frame trigger transistor M14 is the same as that of the second odd frame trigger transistor M17. That is, the first odd frame trigger transistor M14 and the second odd frame trigger transistor M17 both may be N-type transistors, or both may be P-type transistors. In an embodiment illustrated in FIG. 2, both of the first odd frame trigger transistor M14 and the second odd frame trigger transistor M17 are N-type transistors.

In the odd frame period, the signal input through the first frame type signal input terminal GCH1 is an active signal, and the signal input through the second frame type signal input terminal GCH2 is an inactive signal. Therefore, the first odd frame trigger transistor M14 and the second odd frame trigger transistor M17 are turned on. The active signal output by the pull-down control sub-circuit 310 is transmitted to the control terminal PD1 of the odd frame pull-down circuit 410 through the first odd frame trigger transistor M14, thereby electrically connecting the input terminal and the output terminals of the odd frame pull-down circuit 410.

In the even frame period, the signal input through the second frame type signal input terminal GCH2 is an active signal, and the signal input through the first frame type signal input terminal GCH1 is an inactive signal. Therefore, the first odd frame trigger transistor M14 and the second odd frame trigger transistor M17 are turned off and provide no signal to the odd frame pull-down circuit 410. That is, the odd frame pull-down circuit 410 at the very moment is in off state.

Similarly, in the present disclosure, the even frame trigger sub-circuit 420 includes a first even frame trigger transistor M12 and a second even frame trigger transistor M16.

Figure 2:
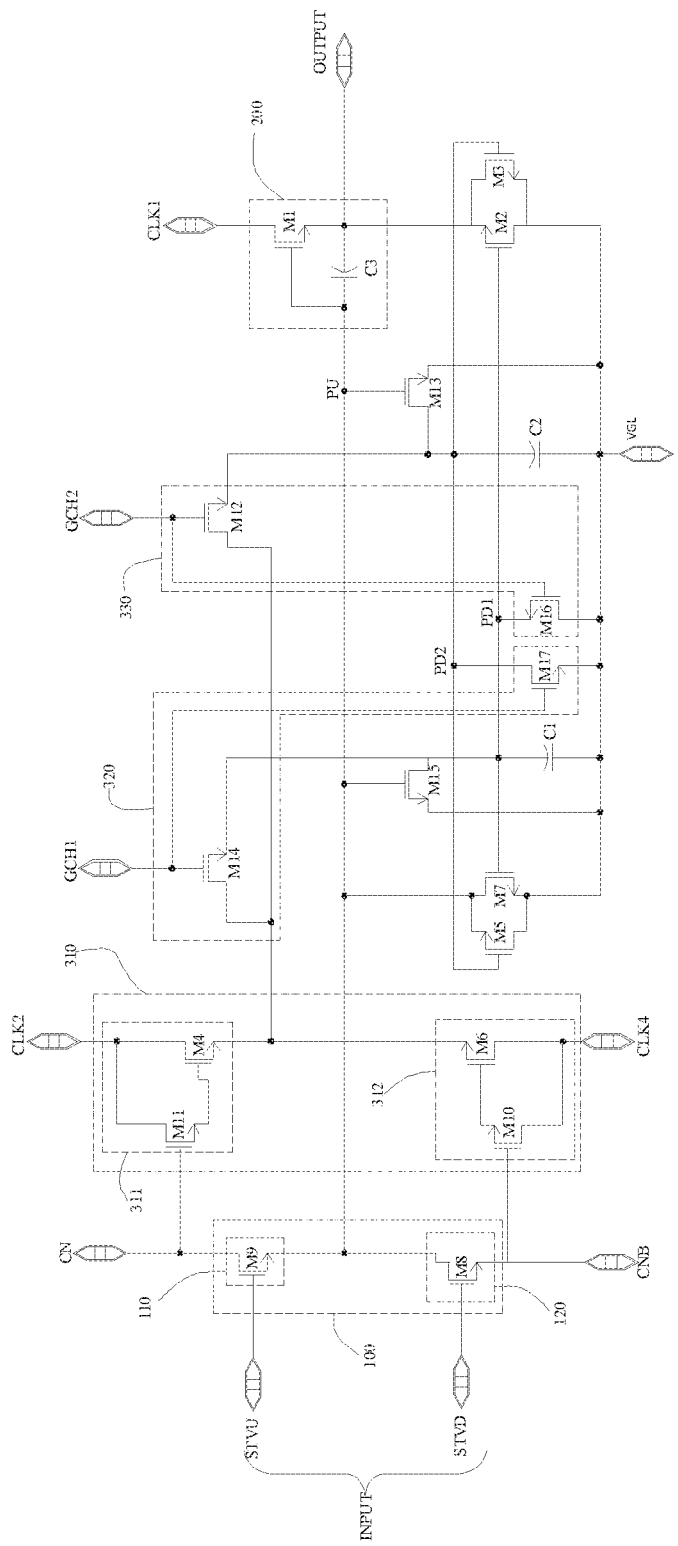
FIG. 2 is a circuit schematic diagram of a shift register unit according to an embodiment of the present disclosure.

As illustrated in FIG. 2, a gate electrode of the first even frame trigger transistor M12 is electrically connected to the second frame type signal input terminal GCH2, a first electrode of the first even frame trigger transistor M12 is electrically connected to the first input terminal of the even frame trigger sub-circuit 330, and a second electrode of the first even frame trigger transistor M12 is electrically connected to the second output terminal of the even frame trigger sub-circuit 330.

A gate electrode of the second even frame trigger transistor M16 is electrically connected to the second frame type signal input terminal GCH2, a first electrode of the second even frame trigger transistor M16 is electrically connected to the second level signal terminal VGL, and a second electrode of the second even frame trigger transistor M16 is electrically connected to the first output terminal of the even frame trigger sub-circuit 330.

In the odd frame period, the signal input through the first frame type signal input terminal GCH1 is an active signal, and the signal input through the second frame type signal input terminal GCH2 is an inactive signal. Therefore, the first even frame trigger transistor M12 and the second even frame trigger transistor M16 are in off state. That is, in the odd frame period, the even frame trigger sub-circuit 330 provides no signal to the even frame pull-down circuit 420, such that the even frame pull-down circuit 420 is in off state.

In the even frame period, the signal input through the second frame type signal input terminal GCH2 is an active signal, and the signal input through the first frame type signal input terminal GCH1 is an inactive signal. At this time, the first even frame trigger transistor M12 and the second even frame trigger transistor M16 are both turned on to transmit the signal output by the pull-down control sub-circuit 310 to the control terminal PD2 of the even frame pull-down circuit 420, such that the first output terminal and the second output terminal of the even frame pull-down circuit 420 are electrically connected to the input terminal of the even frame pull-down circuit 420 to discharge the signal output terminal OUTPUT and the control terminal PU of the pull-up circuit.

It should be noted that the type of the first even frame trigger transistor M12 is the same as that of the second even frame trigger transistor M16. That is, the first even frame trigger transistor M12 and the second even frame trigger transistor M16 both may be N-type transistors, or both may be P-type transistors. In an embodiment illustrated in FIG. 2, both of the first even frame trigger transistor M12 and the second even frame trigger transistor M16 are N-type transistors.

Further, all of the first odd frame trigger transistor M14, the second odd frame trigger transistor M17, the first even frame trigger transistor M12 and the second even frame trigger transistor M16 have a same type.

In the present disclosure, there is no particular limitation on the specific structure of the odd frame pull-down circuit 410. In an embodiment illustrated in FIG. 2, the odd frame pull-down circuit 410 includes a first odd frame pull-down transistor M2, a second odd frame pull-down transistor M7, and a third odd frame pull-down transistor M15.

Specifically, a gate electrode of the first odd frame pull-down transistor M2 is electrically connected to the control terminal PD1 of the odd frame pull-down circuit 410, a first electrode of the first odd frame pull-down transistor M2 is electrically connected to the signal output terminal OUTPUT, and a second electrode of the first odd frame pull-down transistor M2 is electrically connected to the second level signal terminal VGL.

A first electrode of the second odd frame pull-down transistor M7 is electrically connected to the control terminal PU of the pull-up circuit 200, a second electrode of the second odd frame pull-down transistor M7 is electrically connected to the second level signal terminal VGL, and a gate electrode of the second odd frame pull-down transistor M7 is electrically connected to the control terminal PD1 of the odd frame pull-down circuit 410.

A gate electrode of the third odd frame pull-down transistor M15 is electrically connected to the control terminal PU of the pull-up circuit 200, a first electrode of the third odd frame pull-down transistor M15 is electrically connected to the control terminal PD1 of the odd frame pull-down circuit 410, and a second electrode of the third odd frame pull-down transistor M15 is electrically connected to the second level signal terminal VGL.

As described above, the odd frame pull-down circuit 410 is configured to electrically connect the second level signal terminal VGL to the signal output terminal OUTPUT and the control terminal PU of the pull-up circuit 200 in the pull-down stage of the odd frame period.

When the control terminal PD1 of the odd frame pull-down circuit 410 receives an active signal, the first odd frame pull-down transistor M2 is turned on, so that the second level signal terminal VGL is electrically connected to the signal output terminal OUTPUT. Meanwhile, the second odd frame pull-down transistor M7 is turned on, so that the second level signal terminal VGL is electrically connected to the control terminal PU of the pull-up circuit 200.

In the input stage and the output stage of the odd frame period, since the control terminal PU of the pull-up circuit 200 provides an active level signal, the third odd frame pull-down transistor M15 is turned on, and thus the second level signal is transmitted to the control terminal PD1 of the odd frame pull-down circuit through the first odd frame trigger transistor M14 such that the first odd frame pull-down transistor M2 and the second odd frame pull-down transistor M7 are controlled to be turned off, thereby ensuring a stable output signal.

To ensure the stable operation of the odd frame pull-down circuit, in one example, the odd frame pull-down transistor 410 further includes a first storage capacitor C1, a first end of the first storage capacitor C1 is electrically connected to the control terminal PD1 of the odd frame pull-down circuit 410, and a second end of the first storage capacitor C1 is electrically connected to the second level signal terminal VGL. The first storage capacitor facilitates maintaining the voltage of the control terminal PD1 of the odd frame pull-down circuit 410 and preventing current leakage of the control terminal PD1 of the odd frame pull-down circuit 410 when the shift register unit works in an extreme environment (e.g., a high temperature environment, etc.), thereby guaranteeing proper functioning of the shift register unit.

In the present disclosure, there is no particular limitation on the specific structure of the even frame pull-down circuit 420. In an embodiment illustrated in FIG. 2, the even frame pull-down circuit includes a first even frame pull-down transistor M3, a second even frame pull-down transistor M5, and a third even frame pull-down transistor M13.

A gate electrode of the first even frame pull-down transistor M3 is electrically connected to the control terminal PD2 of the even frame pull-down circuit 420, a first electrode of the first even frame pull-down transistor M3 is electrically connected to the signal output terminal OUTPUT, and a second electrode of the first even frame pull-down transistor M3 is electrically connected to the second level signal terminal VGL.

A gate electrode of the second even frame pull-down transistor M5 is electrically connected to the control terminal PD2 of the even frame pull-down circuit 420, a first electrode of the second even frame pull-down transistor M5 is electrically connected to the control terminal PU of the pull-up circuit 200, and a second electrode of the second even frame pull-down transistor M5 is electrically connected to the second level signal terminal VGL.

A gate electrode of the third even frame pull-down transistor M13 is electrically connected to the control terminal PU of the pull-up circuit 200, a first electrode of the third even frame pull-down transistor M13 is electrically connected to the second level signal terminal VGL, and a second electrode of the third even frame pull-down transistor M13 is electrically connected to the control terminal PD2 of the even frame pull-down circuit 420.

In the even frame period, when the gate electrode of the first even frame pull-down transistor M3 receives an active signal, the first even frame pull-down transistor M3 is turned on, so that the second level signal provided by the second level signal terminal VGL is transmitted to the signal output terminal OUTPUT to discharge the signal output terminal OUTPUT. Meanwhile, the gate electrode of the second even frame pull-down transistor M5 receives an active signal, and the second even frame pull-down transistor M5 is turned on, so that the second level signal terminal VGL is electrically connected to the control terminal PU of the pull-up circuit 200 to discharge the control terminal PU of the pull-up circuit 200.

In one example, the even frame pull-down circuit 420 further includes a second storage capacitor C2, a first end of the second storage capacitor C2 is electrically connected to the control terminal PD2 of the even frame pull-down circuit 420, and a second end of the second storage capacitor C2 is electrically connected to the second level signal terminal VGL. The second storage capacitor C2 facilitates maintaining the voltage of the control terminal PD2 of the even frame pull-down circuit and preventing current leakage of the control terminal PD2 of the even frame pull-down circuit when the shift register unit works in an extreme environment (e.g., a high temperature environment, etc.), thereby guaranteeing proper functioning of the shift register unit.

In the present disclosure, there is no particular limitation on the input circuit 100, as long as the input circuit 100 is capable of charging the control terminal PU of the pull-up circuit 200 in the input stage.

In one example, when the shift register including the above shift register unit is applied in a display panel, the display panel may be forward scanned or inversely scanned. In this case, as illustrated in FIG. 2, the trigger signal input terminal INPUT of the shift register unit includes a forward trigger signal input terminal STVU and an inverse trigger signal input terminal STVD, the input circuit 100 includes a forward input circuit 110 and an inverse input circuit 120. The shift register unit includes a forward signal terminal CN and an inverse signal terminal CNB, and the pull-down control sub-circuit 310 includes a forward pull-down control sub-circuit 311 and an inverse pull-down control sub-circuit 312.

In a forward scan mode, an active signal is provided through the forward signal terminal CN, and an inactive signal is provided through the inverse signal terminal CNB. In an inverse scan mode, an inactive signal is provided through the forward signal terminal CN, and an active signal is provided through the inverse signal terminal CNB. It can be seen that the forward input circuit 110 serves as an input circuit and the inverse input circuit 120 serves as a reset circuit in the forward scan mode, while the forward input circuit 110 serves as a reset circuit and the inverse input circuit 120 serves as an input circuit in the inverse scan mode.

A control terminal of the forward input circuit 110 is electrically connected to the forward trigger signal input terminal STVU, an input terminal of the forward input circuit 110 is electrically connected to the forward signal terminal CN, and an output terminal of the forward input circuit 110 is electrically connected to the control terminal PU of the pull-up circuit 200. When the control terminal of the forward input circuit 110 receives an active signal, the input terminal of the forward input circuit 110 is electrically connected to the output terminal of the forward input circuit 110.

A control terminal of the inverse input circuit 120 is electrically connected to the inverse trigger signal input terminal STVD, an input terminal of the inverse input circuit 120 is electrically connected to the inverse signal terminal CNB, and an output terminal of the inverse input circuit 120 is electrically connected to the control terminal PU of the pull-up circuit 200. When the control terminal of the inverse input circuit 120 receives an active signal, the input terminal of the inverse input circuit 120 is electrically connected to the output terminal of the inverse input circuit 120.

A control terminal of the forward pull-down control sub-circuit 311 is electrically connected to the forward signal terminal CN, an input terminal of the forward pull-down control sub-circuit 311 is electrically connected to a second clock signal terminal CLK2, and an output terminal of the forward pull-down control sub-circuit 311 is electrically connected to an output terminal of the inverse pull-down control sub-circuit 312, and electrically connected to the first input terminal of the odd frame trigger sub-circuit 320 and the first input terminal of the even frame trigger sub-circuit 330.

A control terminal of the inverse pull-down control sub-circuit 312 is electrically connected to the inverse signal terminal CNB, and an input terminal of the inverse pull-down control sub-circuit 312 is electrically connected to a fourth clock signal terminal CLK4.

As described above, in the forward scan mode, an active signal is provided by the forward signal terminal CN, and an inactive signal is provided by the inverse signal terminal CNB. Therefore, the active signal provided by the forward signal terminal CN may be provided to the first input terminal of the odd frame trigger sub-circuit 320 and the first input terminal of the even frame trigger sub-circuit 330 through the forward pull-down control sub-circuit 311. In the inverse scan mode, an inactive signal is provided by the forward signal terminal CN, and an active signal is provided by the inverse signal terminal CNB. Therefore, the active signal provided by the inverse signal terminal CNB may be provided to the first input terminal of the odd frame trigger sub-circuit 320 and the first input terminal of the even frame trigger sub-circuit 330 through the inverse pull-down control sub-circuit 312.

In the present disclosure, there is no particular limitation on the specific structure of the forward input circuit. For example, in an embodiment illustrated in FIG. 2, the forward input circuit 110 includes a forward input transistor M9, a gate electrode of the forward input transistor M9 is electrically connected to the control terminal of the forward input circuit 110, a first electrode of the forward input transistor M9 is electrically connected to the input terminal of the forward input circuit 110, and a second electrode of the forward input transistor M9 is electrically connected to the output terminal of the forward input circuit 110.

In the forward scan mode, during the input stage of each frame period, an active signal is input through the forward trigger signal input terminal STVU, and the first and second electrodes of the forward input transistor M9 are controlled to be electrically connected to each other, so that the first level signal input by the forward signal terminal CN is transmitted to the control terminal PU of the pull-up circuit 200 and the control terminal PU of the pull-up circuit 200 is charged.

In an embodiment illustrated in FIG. 2, the inverse input circuit 120 includes an inverse input transistor M8, a gate electrode of the inverse input transistor M8 is electrically connected to the control terminal of the inverse input circuit 120, a first electrode of the inverse input transistor M8 is electrically connected to the inverse input terminal CNB, and a second electrode of the inverse input transistor M8 is electrically connected to the output terminal of the inverse input circuit 120.

The forward input transistor M9 may have the same type as that of the inverse input transistor M8. In an embodiment illustrated in FIG. 2, both of the forward input transistor M9 and the inverse input transistor M8 are N-type transistors.

In the present disclosure, there is no particular limitation on the specific structure of the forward pull-down control sub-circuit 311. For example, in an embodiment illustrated in FIG. 2, the forward pull-down control sub-circuit 311 includes a first forward pull-down control transistor M11 and a second forward pull-down control transistor M4.

A gate electrode of the first forward pull-down control transistor M11 is electrically connected to the control terminal of the forward pull-down control sub-circuit 311, a first electrode of the first forward pull-down control transistor M11 is electrically connected to the second clock signal terminal CLK2, and a second electrode of the first forward pull-down control transistor M11 is electrically connected to a gate electrode of the second forward pull-down control transistor M4.

A first electrode of the second forward pull-down control transistor M4 is electrically connected to the second clock signal terminal CLK2, and a second electrode of the second forward pull-down control transistor M4 is electrically connected to the output terminal of the forward pull-down control sub-circuit 311.

It is readily understood that in the present embodiment, the first forward pull-down control transistor M11 has the same type as that of the second forward pull-down control transistor M4. In the embodiment shown in FIG. 2, the first forward pull-down control transistor M11 and the second forward pull-down control transistor M4 are all N-type transistors.

In the forward scan mode, an active signal is received by the forward signal terminal CN and transmitted to the gate electrode of the first forward pull-down control transistor M11, and the first forward pull-down transistor M11 is turned on. In the pull-down stage of each frame period, an active signal is input from the second clock signal terminal CLK2, so that the active signal can be transmitted to the gate electrode of the second forward pull-down control transistor M4 through the first forward pull-down transistor M11, so that the second forward pull-down control transistor M4 is turned on to transmit the active signal input through the second clock signal terminal CLK2 to the output terminal of the forward pull-down control sub-circuit 311.

In the inverse scan mode, since the forward signal terminal CN receives an inactive signal, the first forward pull-down control transistor M11 is turned off, resulting in that the second forward pull-down control transistor M4 is also turned off. That is, during the inverse scan, the forward pull-down control sub-circuit 311 does not work, thereby prolonging the lifetime of the forward pull-down control sub-circuit 311.

In the present disclosure, there is no particular limitation on the specific structure of the inverse pull-down control sub-circuit 312. For example, in an embodiment illustrated in FIG. 2, the inverse pull-down control sub-circuit 312 includes a first inverse pull-down control transistor M10 and a second inverse pull-down control transistor M6.

A gate electrode of the first inverse pull-down control transistor M10 is electrically connected to the inverse signal terminal CNB, a first electrode of the first inverse pull-down control transistor M10 is electrically connected to the fourth clock signal terminal CLK4, and a second electrode of the first inverse pull-down control transistor M10 is electrically connected to a gate electrode of the second inverse pull-down control transistor M6.

A first electrode of the second inverse pull-down control transistor M6 is electrically connected to the fourth clock signal terminal CLK4, and a second electrode of the second inverse pull-down control transistor M6 is electrically connected to the output terminal of the inverse pull-down control sub-circuit 312.

In the forward scan mode, an inactive signal is provided through the inverse signal terminal CNB, and thus the first inverse pull-down control transistor M10 is turned off, resulting in that the second inverse pull-down control transistor M6 is also turned off. Therefore, during the forward scan mode, the inverse pull-down control sub-circuit 312 does not work, thereby prolonging the lifetime of the inverse pull-down control sub-circuit 312.

In the inverse scan mode, an active signal is provided through the inverse signal terminal CNB, so the first inverse pull-down control transistor M10 is turned on. During the pull-down stage of each frame period in the inverse scan mode, the fourth clock signal terminal CLK4 provides an active signal, and the active signal is transmitted to the gate electrode of the second inverse pull-down control transistor M6 through the first inverse pull-down control transistor M10, so that the second inverse pull-down control transistor M6 is turned on to transmit the active signal provided by the fourth clock signal terminal CLK4 to the output terminal of the inverse pull-down control sub-circuit 312.

In the present disclosure, there is no particular limitation on the specific structure of the pull-up circuit 200. For example, in an embodiment illustrated in FIG. 2, the pull-up circuit 200 includes a pull-up transistor M1 and a third storage capacitor C3, and the initial signal terminal includes a first clock signal terminal CLK1.

A gate electrode of the pull-up transistor M1 is electrically connected to the control terminal PU of the pull-up circuit 200, a first electrode of the pull-up transistor M1 is electrically connected to the first clock signal terminal CLK1, and a second electrode of the pull-up transistor M1 is electrically connected to the signal output terminal OUTPUT.

A first end of the third storage capacitor C3 is electrically connected to the gate electrode of the pull-up transistor M1, and a second end of the third storage capacitor C3 is electrically connected to the signal output terminal OUTPUT.

In the input stage, the active signal input through the input circuit 100 is stored in the third storage capacitor C3. In the output stage, the control terminal PU of the pull-up circuit 200 is coupled to a higher level by the bootstrap of the third storage capacitor C3 so that the pull-up transistor M1 may be turned on. In addition, in the output stage, the first clock signal terminal CLK1 outputs an active signal, so that the active signal can be output to the signal output terminal OUTPUT.

Hereinafter, the operation principle of an embodiment of the shift register unit according to the present disclosure will be described with reference to FIG. 2.

In the embodiment illustrated in FIG. 2, all transistors are N-type transistors. In this case, an active signal refers to a high level signal, and an inactive signal refers to a low level signal. It should be noted that the present disclosure is not limited thereto, and in a case where the transistors are P-type transistors, an active signal may refer to a low level signal, and an inactive signal may refer to a high level signal.

In one example, the second level signal provided by the second level signal terminal VGL may be a low level signal.

The input circuit 100 includes the forward input circuit 110 and the inverse input circuit 120. The forward input circuit 110 includes the forward input transistor M9, and the inverse input circuit 120 includes the inverse input transistor M8.

The pull-up circuit 200 includes the pull-up transistor M1 and the third storage capacitor C3.

The pull-down control circuit 300 includes the pull-down control sub-circuit 310, the odd frame trigger sub-circuit 320, and the even frame trigger sub-circuit 330.

The pull-down control sub-circuit 310 includes the forward pull-down control sub-circuit 311 and the inverse pull-down control sub-circuit 312. The forward pull-down control sub-circuit 311 includes the first forward pull-down control transistor M11 and the second forward pull-down control transistor M4. The inverse pull-down control sub-circuit 312 includes the first inverse pull-down control transistor M10 and the second inverse pull-down control transistor M6.

The odd frame trigger sub-circuit 320 includes the first odd frame trigger transistor M14 and the second odd frame trigger transistor M17.

The even frame trigger sub-circuit 330 includes the first even frame trigger transistor M12 and the second even frame trigger transistor M16.

The odd frame pull-down circuit includes the first odd frame pull-down transistor M2, the second odd frame pull-down transistor M7, the third odd frame pull-down transistor M15, and the first storage capacitor C1.

The even frame pull-down circuit includes the first even frame pull-down transistor M3, the second even frame pull-down transistor M5, the third even frame pull-down transistor M13, and the second storage capacitor C2.

Hereinafter, the connection relationship between the transistors will be described in detail.

The gate electrode of the forward input transistor M9 is electrically connected to the forward trigger signal input terminal STVU, the first electrode of the forward input transistor M9 is electrically connected to the forward signal terminal CN, and the second electrode of the forward input transistor M9 is electrically connected to the second electrode of the inverse input transistor M8. The gate electrode of the inverse input transistor M8 is electrically connected to the inverse trigger signal input terminal STVD, and the first electrode of the inverse input transistor M8 is electrically connected to the inverse signal terminal CNB.

The gate electrode of the first forward pull-down control transistor M11 is electrically connected to the control terminal of the forward pull-down control sub-circuit 311, the first electrode of the first forward pull-down control transistor M11 is electrically connected to the second clock signal terminal CLK2, and the second electrode of the first forward pull-down control transistor M11 is electrically connected to the gate electrode of the second forward pull-down control transistor M4.

The first electrode of the second forward pull-down control transistor M4 is electrically connected to the second clock signal terminal CLK2, and the second electrode of the second forward pull-down control transistor M4 is electrically connected to the first electrode of the first odd frame trigger transistor M14.

The gate electrode of the first inverse pull-down control transistor M10 is electrically connected to the inverse signal terminal CNB, the first electrode of the first inverse pull-down control transistor M10 is electrically connected to the fourth clock signal terminal CLK4, and the second electrode of the first inverse pull-down control transistor M10 is electrically connected to the gate electrode of the second inverse pull-down control transistor M6.

The first electrode of the second inverse pull-down control transistor M6 is electrically connected to the fourth clock signal terminal CLK4, and the second electrode of the second inverse pull-down control transistor M6 is electrically connected to the first electrode of the first odd frame trigger transistor M14.

The gate electrode of the first odd frame trigger transistor M14 is electrically connected to the first frame type signal input terminal GCH1, the first electrode of the first odd frame trigger transistor M14 is electrically connected to the first input terminal of the odd frame trigger sub-circuit 320, and the second electrode of the first odd frame trigger transistor M14 is electrically connected to the gate electrodes of the first odd frame pull-down transistor M2 and the second odd frame pull-down transistor M7.

The gate electrode of the second odd frame trigger transistor M17 is electrically connected to the first frame type signal input terminal GCH1, the first electrode of the second odd frame trigger transistor M17 is electrically connected to the second level signal terminal VGL, and the second electrode of the second odd frame trigger transistor M17 is electrically connected to the gate electrode of the first even frame pull-down transistor M3 and the gate electrode of the second even frame pull-down transistor M5.

The gate electrode of the first even frame trigger transistor M12 is electrically connected to the second frame type signal input terminal GCH2, the first electrode of the first even frame trigger transistor M12 is electrically connected to the first input terminal of the even frame trigger sub-circuit 330, and the second electrode of the first even frame trigger transistor M12 is electrically connected to the gate electrodes of the first even frame pull-down transistor M3 and the second even frame pull-down transistor M5.

The gate electrode of the second even frame trigger transistor M16 is electrically connected to the second frame type signal input terminal GCH2, the first electrode of the second even frame trigger transistor M16 is electrically connected to the second level signal terminal VGL, and the second electrode of the second even frame trigger transistor M16 is electrically connected to the gate electrode of the first odd frame pull-down transistor M2 and the gate electrode of the second odd frame pull-down transistor M7.

The first electrode of the first odd frame pull-down transistor M2 is electrically connected to the signal output terminal OUTPUT, and the second electrode of the first odd frame pull-down transistor M2 is electrically connected to the second level signal terminal VGL. The first electrode of the second odd frame pull-down transistor M7 is electrically connected to the first end of the third storage capacitor C3, and the second electrode of the second odd-frame pull-down transistor M7 is electrically connected to the second level signal terminal VGL. The gate electrode of the third odd frame pull-down transistor M15 is electrically connected to the first end of the third storage capacitor C3, the first electrode of the third odd frame pull-down transistor M15 is electrically connected to the gate electrode of the first odd frame pull-down transistor M2, and the second electrode of the odd frame pull-down transistor M15 is electrically connected to the second level signal terminal VGL. The first end of the first storage capacitor C1 is electrically connected to the control terminal PD1 of the odd frame pull-down circuit 410, and the second end of the first storage capacitor C1 is electrically connected to the second level signal terminal VGL.

The gate electrode of the first even frame pull-down transistor M3 is electrically connected to the control terminal PD2 of the even frame pull-down circuit 420, the first electrode of the first even frame pull-down transistor M3 is electrically connected to the signal output terminal OUTPUT, and the second electrode of the first even frame pull-down transistor M3 is electrically connected to the second level signal terminal VGL. The first electrode of the second even frame pull-down transistor M5 is electrically connected to the control terminal PU of the pull-up circuit 200, and the second electrode of the second even frame pull-down transistor M5 is electrically connected to the second level signal terminal VGL. The gate electrode of the third even frame pull-down transistor M13 is electrically connected to the first end of the third storage capacitor C3, the first electrode of the third even frame pull-down transistor M13 is electrically connected to the second level signal terminal VGL, and the second electrode of the third even frame pull-down transistor M13 is electrically connected to the control terminal PD2 of the even frame pull-down circuit 420. The first end of the second storage capacitor C2 is electrically connected to the gate electrodes of the first even frame pull-down transistor M3 and the second even frame pull-down transistor M5, and the second end of the second storage capacitor C2 is electrically connected to the second level signal terminal VGL.

Hereinafter, the operation principle of the shift register unit illustrated in FIG. 2 will be described in conjunction with the timing diagram of FIG. 3.

It will be readily understood by those skilled in the art that one frame period includes a plurality of operating cycles, and each operating cycle includes three stages: an input stage T1, an output stage T2, and a pull-down stage T3.

Figure 3:
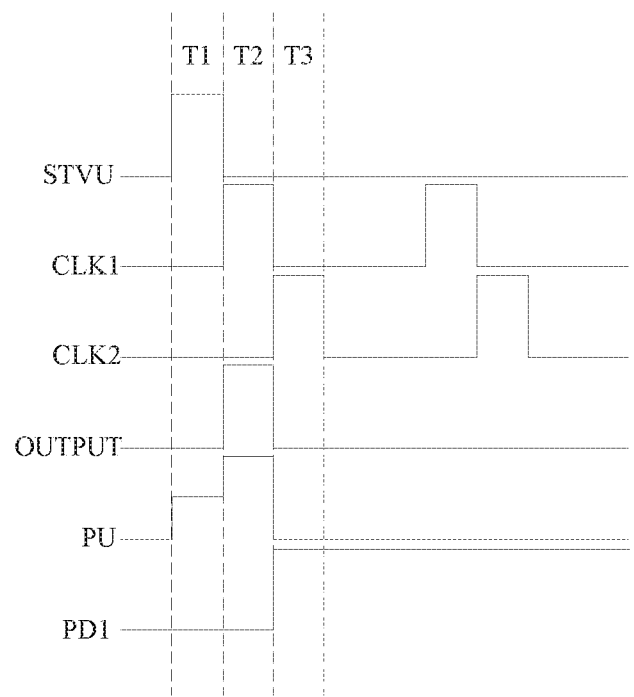
FIG. 3 is a timing diagram illustrating one operating cycle of a shift register unit.

FIG. 3 illustrates a timing diagram when the shift register unit operates in the forward scan mode. Although not shown, it should be noted that in this forward mode, the forward signal terminal CN provides an active signal and the inverse signal terminal CNB provides an inactive signal.

Hereinafter, the operation process during the odd frame period in the forward scan mode will be described below with reference to FIG. 3. It should be noted that in this case, the first frame type signal input terminal GCH1 provides an active signal, and the second frame type signal input terminal GCH2 provides an inactive signal.

In the input stage T1, the forward trigger signal input terminal STVU provides an active signal. The first clock signal terminal CLK1 provides an inactive signal, and the second clock signal terminal CLK2 provides an inactive signal. The forward input transistor M9 is turned on, so that the third storage capacitor C3 of the pull-up circuit 200 is charged, and the control terminal PU of the pull-up circuit 200 is maintained at a high level, resulting in that the pull-up transistor M1 is turned on. In this stage, the third odd frame pull-down transistor M15 and the third even frame pull-down transistor M13 are turned on, so that the control terminal PD1 of the odd frame pull-down circuit 410 and the control terminal PD2 of the even frame pull-down circuit 420 are all at the second level signal (e.g., low level) provided by second level signal terminal VGL. Therefore, the signal output by the signal output terminal OUTPUT is an inactive signal (e.g., a low level signal) provided by the first clock signal terminal CLK1.

In the output stage T2, the forward trigger signal input terminal STVU provides an inactive signal. The first clock signal terminal CLK1 provides an active signal. The gate electrode of the pull-up transistor M1 is coupled to a higher level by the bootstrap of the third storage capacitor C3, so that the pull-up transistor M1 is turned on. In this stage, the third odd frame pull-down transistor M15 and the third even frame pull-down transistor M13 are turned on, so that the control terminal PD1 of the odd frame pull-down circuit 410 and the control terminal PD2 of the even frame pull-down circuit 420 are all at the second level signal provided by second level signal terminal VGL. Therefore, the signal output by the signal output terminal OUTPUT is a high level signal provided by the first clock signal terminal CLK1.

In the pull-down stage T3, the forward trigger signal input terminal STVU provides an inactive signal. The first clock signal terminal CLK1 provides an inactive signal, and the second clock signal terminal CLK2 provides an active signal. The active signal provided by the second clock signal terminal CLK2 is transmitted to the first electrode of the first odd frame trigger transistor M14 through the second forward pull-down control transistor M4, and transmitted to the control terminal PD1 of the odd frame pull-down circuit 410 through the first odd frame trigger transistor M14. The control terminal PD1 of the odd frame pull-down circuit 410 is at high level, which causes the first odd frame pull-down transistor M2 and the second odd frame pull-down transistor M7 to be turned on, so that the signal output terminal OUTPUT and the control terminal PU of the pull-up circuit 200 are pulled down to the second level (e.g., low level), respectively.

Hereinafter, the operation process during the even frame period in the forward scan mode will be described below with reference to FIG. 3. It should be noted that, in this case, the forward signal terminal CN provides an active signal, the inverse signal terminal CNB provides an inactive signal, the first frame type signal input terminal GCH1 provides an inactive signal, and the second frame type signal input terminal GCH2 provides an active signal.

In the input stage T1, the forward trigger signal input terminal STVU provides an active signal. The first clock signal terminal CLK1 provides an inactive signal, and the second clock signal terminal CLK2 provides an inactive signal. The forward input transistor M9 is turned on, so that the third storage capacitor C3 of the pull-up circuit 200 is charged, and the control terminal PU of the pull-up circuit 200 is maintained at a high level, resulting in that the pull-up transistor M1 is turned on. In this stage, the third odd frame pull-down transistor M15 and the third even frame pull-down transistor M13 are turned on, so that the control terminal PD1 of the odd frame pull-down circuit 410 and the control terminal PD2 of the even frame pull-down circuit 420 are all at the second level signal (e.g., low level) provided by second level signal terminal VGL. Therefore, the signal output by the signal output terminal OUTPUT is an inactive signal (e.g., a low level signal) provided by the first clock signal terminal CLK1.

In the output stage T2, the forward trigger signal input terminal STVU provides an inactive signal. The first clock signal terminal CLK1 provides an active signal. The gate electrode of the pull-up transistor M1 is coupled to a higher level by the bootstrap of the third storage capacitor C3, so that the pull-up transistor M1 is turned on. In this stage, the third odd frame pull-down transistor M15 and the third even frame pull-down transistor M13 are turned on, so that the control terminal PD1 of the odd frame pull-down circuit 410 and the control terminal PD2 of the even frame pull-down circuit 420 are all at the second level signal provided by second level signal terminal VGL. Therefore, the signal output by the signal output terminal OUTPUT is a high level signal provided by the first clock signal terminal CLK1.

In the pull-down stage T3, the forward trigger signal input terminal STVU provides an inactive signal. The first clock signal terminal CLK1 provides an inactive signal, and the second clock signal terminal CLK2 provides an active signal. The active signal provided by the second clock signal terminal CLK2 is transmitted to the first electrode of the first even frame trigger transistor M12 through the second forward pull-down control transistor M4, and transmitted to the control terminal PD2 of the even frame pull-down circuit 420 through the first even frame trigger transistor M12. The control terminal PD2 of the even frame pull-down circuit is at high level, which causes the first even frame pull-down transistor M3 and the second even frame pull-down transistor M5 to be turned on, so that the signal output terminal OUTPUT and the control terminal PU of the pull-up circuit 200 are pulled down to the second level (e.g., low level), respectively.

As another aspect of the present disclosure, there is provided a shift register including a plurality of cascaded shift register units, and each of the plurality of shift register units is the aforementioned shift register unit according to the present disclosure.

As described above, since the shift register includes a plurality of pull-down circuits, different pull-down circuits work in turn in different frame periods, so that the lifetime of the entire shift register unit can be prolonged, thereby prolonging the lifetime of the shift register.

Figure 4:
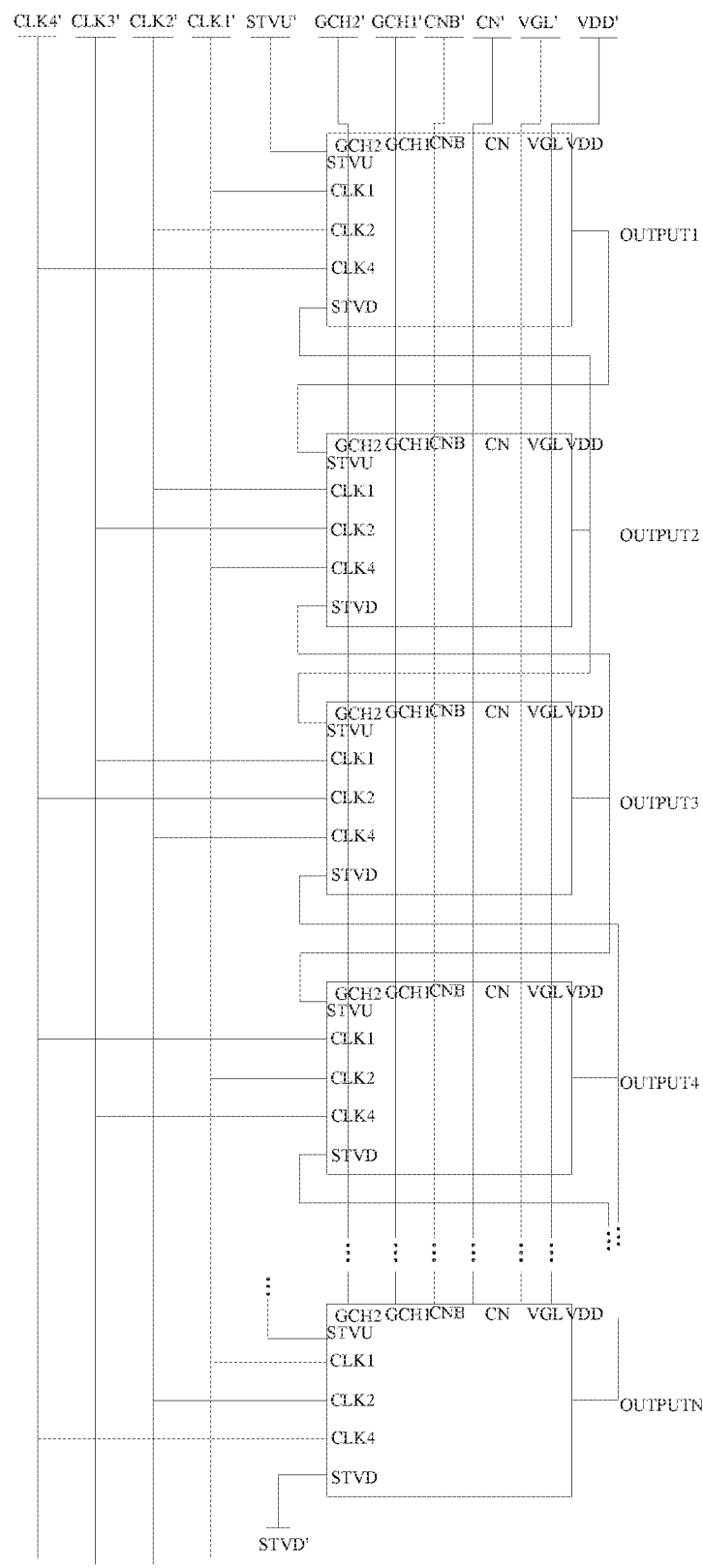
FIG. 4 is a schematic diagram of a gate driving circuit according to an embodiment of the present disclosure.

FIG. 4 is a schematic diagram of a shift register capable of both of the forward scan and the inverse scan according to the present disclosure. It can be seen from FIG. 4 that, in adjacent two stages of shift register units, the signal output terminal OUTPUT of the previous stage of shift register unit is electrically connected to the forward trigger signal input terminal STVU of the subsequent stage of shift register unit. The inverse trigger signal input terminal STVD of the previous stage of shift register unit is electrically connected to the signal output terminal OUTPUT of the subsequent stage of shift register unit.

As illustrated in FIG. 4, in addition to the plurality of stages of cascaded shift register units, the shift register further includes a first clock signal line CLK1', a second clock signal line CLK2', a third clock signal line CLK3', a fourth clock signal line CLK4', a forward trigger signal line STVU', an inverse trigger signal line STVD', a first frame type signal line GCH1', a second frame type signal line GCH2', a forward signal line CN', an inverse signal line CNB', a first level signal line VDD', and a second level signal line VGL'.

As illustrated in FIG. 4, the first level signal line VDD' is connected to the first level signal terminals VDD of the stages of shift register units, respectively, and the second level signal line VGL' is connected to the second level signal terminals VGL of the stages of shift register units, respectively.

Starting from the first stage of shift register unit, in each successive four stages of shift register units, the first clock signal terminal CLK1 of the first stage of shift register unit is connected to the first clock signal line CLK1', the second clock signal terminal CLK2 of the first stage of shift register unit is connected to the second clock signal line CLK2', and the fourth clock signal terminal CLK4 of the first stage of shift register unit is connected to the fourth clock signal line CLK4'; the first clock signal terminal CLK1 of the second stage of shift register unit is connected to the second clock signal line CLK2', the second clock signal terminal CLK2 of the second stage of shift register unit is connected to the third clock signal line CLK3', and the fourth clock signal terminal CLK4 of the second stage of shift register unit is connected to the first clock signal line CLK1'; the first clock signal terminal CLK1 of the third stage of shift register unit is connected to the third clock signal line CLK3', the second clock signal terminal CLK2 of the third stage of shift register unit is connected to the fourth clock signal line CLK4', and the fourth clock signal terminal CLK4 of the third stage of shift register unit is connected to the second clock signal line CLK2'; and the first clock signal terminal CLK1 of the fourth stage of shift register unit is connected to the fourth clock signal line CLK4', the second clock signal terminal CLK2 of the fourth stage of shift register unit is connected to the first clock signal line CLK1', and the fourth clock signal terminal CLK4 of the fourth stage of shift register unit is connected to the third clock signal line CLK3'.

The forward trigger signal input terminal STVU of the first stage of shift register unit is connected to the forward trigger signal line STVU', and the inverse trigger signal input terminal of the last stage of shift register unit is connected to the inverse trigger signal line STVD'.

In FIG. 4, the output terminal of the first stage of shift register unit is labeled as OUTPUT1, the output terminal of the second stage of shift register unit is labeled as OUTPUT2, the output terminal of the third stage of shift register unit is labeled as OUTPUT3, the output terminal of the fourth stage of shift register unit is labeled as OUTPUT4, and the output terminal of the Nth stage of shift register unit is labeled as OUTPUTN.

Since the forward input circuit and the inverse input circuit can be used in the forward scan and the inverse scan, respectively, the configuration having a shift register unit capable of forward scan and inverse scan can further increase the lifetime of the shift register.

Figure 5:
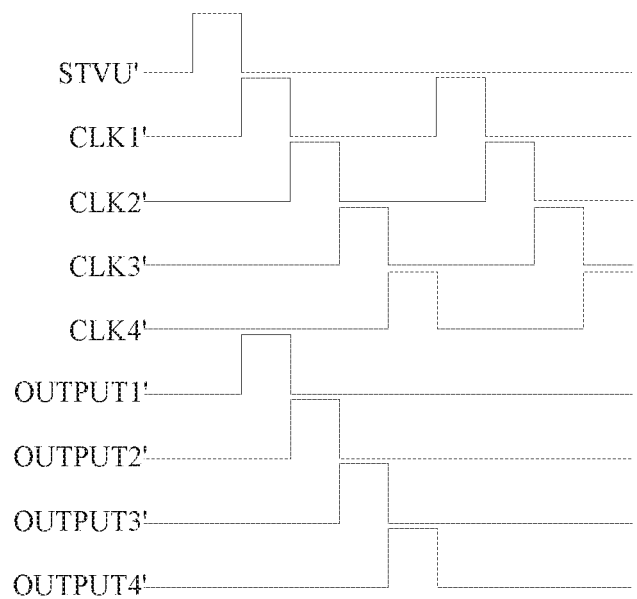
FIG. 5 is a timing diagram in a case of forward scanning.

FIG. 5 illustrates the timing of the signals output from the signal output terminals of the first four stages of shift register units and from each signal terminal in the forward scan mode.

Figure 6:
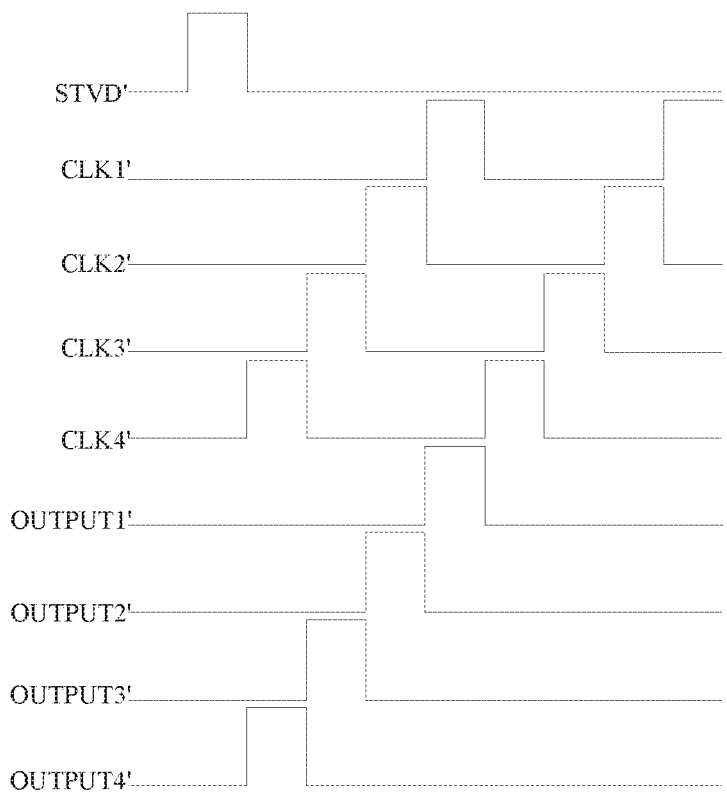
FIG. 6 is a timing diagram in a case of inverse scanning.

FIG. 6 illustrates the timing of the signals output from the signal output terminals of the first four stages of shift register units and from each signal terminal in the inverse scan mode.

As a third aspect of the present disclosure, there is provided a gate driving circuit, wherein the gate driving circuit includes a shift register and a frame signal determination unit, the shift register being the aforementioned shift register according to the present disclosure, and the frame signal determination unit being configured to output a frame trigger signal indicating a sequence number of a frame to the shift register unit.

In the present disclosure, the frame trigger signal indicating a sequence number of a frame refers to the signal indicating the sequence number of the frame in one multi-frame period. For example, in a case where the multi-frame period includes odd frames and even frames, the frame trigger signal indicating the sequence number of a frame may be a signal indicating an odd frame and a signal indicating an even frame (e.g., the signals provided by the first frame type signal input terminal and the second frame type signal input terminal, respectively).

As a fourth aspect of the present disclosure, there is provided a display panel including a gate driving circuit, wherein the gate driving circuit is the aforementioned gate driving circuit according to the present disclosure.

Since the aforementioned gate driving circuit provided by the present disclosure has a longer lifetime, the display panel also has a longer lifetime.

It can be understood that the foregoing implementations are merely exemplary implementations used for describing the principle of the present invention, but the present disclosure is not limited thereto. Those of ordinary skill in the art may make various variations and improvements without departing from the spirit and essence of the present disclosure, and these variations and improvements shall also fall into the protection scope of the present disclosure.

What is claimed is:

1. A shift register unit, comprising a trigger signal input terminal, an input circuit, a pull-up circuit, a pull-down control circuit, a plurality of pull-down circuits, and a signal output terminal, wherein the trigger signal input terminal is electrically connected to a control terminal of the input circuit, and configured to provide an active signal to the control terminal of the input circuit in an input stage of the shift register unit, an output terminal of the input circuit is electrically connected to a control terminal of the pull-up circuit, and the input circuit is configured to provide an active signal to the control terminal of the pull-up circuit when the control terminal of the input circuit receives an active signal, an input terminal of the pull-up circuit is electrically connected to an initial signal terminal, an output terminal of the pull-up circuit is electrically connected to the signal output terminal, and the pull-up circuit is configured to electrically connect the input terminal of the pull-up circuit to the output terminal of the pull-up circuit when the control terminal of the pull-up circuit receives an active signal, an input terminal of each of the pull-down circuits is electrically connected to a second level signal terminal, a first output terminal of each of the pull-down circuits is electrically connected to the signal output terminal, a second output terminal of each of the pull-down circuits is electrically connected to the control terminal of the pull-up circuit, and each pull-down circuit is configured to electrically connect an input terminal of the pull-down circuit to the first and second output terminals of the pull-down circuit when a control terminal of the pull-down circuit receives an active signal, and the pull-down control circuit comprises a plurality of pull-down control signal output terminals electrically connected to the control terminals of the pull-down circuits, respectively, and is configured to sequentially provide active signals to the control terminals of respective pull-down circuits in a pull-down stage, such that the pull-down circuits are turned on in different frame periods, respectively, each of the frame periods being a time period for displaying one frame of image.

2. The shift register unit according to claim 1, wherein the different frame periods comprises odd frame periods and even frame periods that alternate with each other, and the pull-down circuits comprise an odd frame pull-down circuit and an even frame pull-down circuit, the pull-down control circuit is configured to output an active signal to a control terminal of the odd frame pull-down circuit and output an inactive signal to a control terminal of the even frame pull-down circuit in a pull-down stage of each odd frame period, and the pull-down control circuit is configured to output an active signal to the control terminal of the even frame pull-down circuit and output an inactive signal to the control terminal of the odd frame pull-down circuit in a pull-down stage of each even frame period.

3. The shift register unit according to claim 2, wherein the pull-down control circuit comprises a pull-down control sub-circuit, an odd frame trigger sub-circuit and an even frame trigger sub-circuit, a first output terminal of the odd frame trigger sub-circuit and a second output terminal of the even frame pull-down circuit are electrically connected to each other to serve as a first output terminal of the pull-down control circuit, and a second output terminal of the odd frame pull-down circuit and a first output terminal of the even frame trigger sub-circuit are electrically connected to each other to serve as a second output terminal of the pull-down control circuit, the shift register unit further comprises a first frame type signal input terminal and a second frame type signal input terminal, the pull-down control sub-circuit is configured to output an active signal in the pull-down stage of each frame period, a control terminal of the odd frame trigger sub-circuit is electrically connected to the first frame type signal input terminal, a first input terminal of the odd frame trigger sub-circuit is electrically connected to an output terminal of the pull-down control sub-circuit, a second input terminal of the odd frame trigger sub-circuit is electrically connected to the second level signal terminal, the first output terminal of the odd frame trigger sub-circuit is electrically connected to the control terminal of the even frame pull-down circuit, the second output terminal of the odd frame trigger sub-circuit is electrically connected to the control terminal of the odd frame pull-down circuit, and the odd frame trigger sub-circuit is configured to electrically connect the second input terminal of the odd frame trigger sub-circuit to the first output terminal of the odd frame trigger sub-circuit and electrically connect the first input terminal of the odd frame trigger sub-circuit to the second output terminal of the odd frame trigger sub-circuit when the control terminal of the odd frame trigger sub-circuit receives an active signal, and a control terminal of the even frame trigger sub-circuit is electrically connected to the second frame type signal input terminal, a first input terminal of the even frame trigger sub-circuit is electrically connected to the output terminal of the pull-down control sub-circuit, a second input terminal of the even frame trigger sub-circuit is electrically connected to the second level signal terminal, the first output terminal of the even frame trigger sub-circuit is electrically connected to the control terminal of the odd frame pull-down circuit, the second output terminal of the even frame trigger sub-circuit is electrically connected to the control terminal of the even frame pull-down circuit, and the even frame trigger sub-circuit is configured to electrically connect the second input terminal of the even frame trigger sub-circuit to the first output terminal of the even frame trigger sub-circuit and electrically connect the first input terminal of the even frame trigger sub-circuit to the second output terminal of the even frame trigger sub-circuit when the control terminal of the even frame trigger sub-circuit receives an active signal.

4. The shift register unit according to claim 3, wherein the odd frame trigger sub-circuit comprises a first odd frame trigger transistor and a second odd frame trigger transistor,
a gate electrode of the first odd frame trigger transistor is electrically connected to the first frame type signal input terminal, a first electrode of the first odd frame trigger transistor is electrically connected to the first input terminal of the odd frame trigger sub-circuit, and a second electrode of the first odd frame trigger transistor is electrically connected to the second output terminal of the odd frame trigger sub-circuit, and
a gate electrode of the second odd frame trigger transistor is electrically connected to the first frame type signal input terminal, a first electrode of the second odd frame trigger transistor is electrically connected to the second level signal terminal, and a second electrode of the second odd frame trigger transistor is electrically connected to the first output terminal of the odd frame trigger sub-circuit.

5. The shift register unit according to claim 3, wherein the even frame trigger sub-circuit comprises a first even frame trigger transistor and a second even frame trigger transistor,
a gate electrode of the first even frame trigger transistor is electrically connected to the second frame type signal input terminal, a first electrode of the first even frame trigger transistor is electrically connected to the first input terminal of the even frame trigger sub-circuit, and a second electrode of the first even frame trigger transistor is electrically connected to the second output terminal of the even frame trigger sub-circuit, and
a gate electrode of the second even frame trigger transistor is electrically connected to the second frame type signal input terminal, a first electrode of the second even frame trigger transistor is electrically connected to the second level signal terminal, and a second electrode of the second even frame trigger transistor is electrically connected to the first output terminal of the even frame trigger sub-circuit.

6. The shift register unit according to claim 2, wherein the odd frame pull-down circuit comprises a first odd frame pull-down transistor, a second odd frame pull-down transistor, and a third odd frame pull-down transistor,
a gate electrode of the first odd frame pull-down transistor is electrically connected to the control terminal of the odd frame pull-down circuit, a first electrode of the first odd frame pull-down transistor is electrically connected to the signal output terminal, and a second electrode of the first odd frame pull-down transistor is electrically connected to the second level signal terminal,
a first electrode of the second odd frame pull-down transistor is electrically connected to the control terminal of the pull-up circuit, a second electrode of the second odd frame pull-down transistor is electrically connected to the second level signal terminal, and a gate electrode of the second odd frame pull-down transistor is electrically connected to the control terminal of the odd frame pull-down circuit, and
a gate electrode of the third odd frame pull-down transistor is electrically connected to the control terminal of the pull-up circuit, a first electrode of the third odd frame pull-down transistor is electrically connected to the control terminal of the odd frame pull-down circuit, and a second electrode of the third odd frame pull-down transistor is electrically connected to the second level signal terminal.

7. The shift register unit according to claim 6, wherein the odd frame pull-down circuit further comprises a first storage capacitor, a first end of the first storage capacitor is electrically connected to the control terminal of the odd frame pull-down circuit, and a second end of the first storage capacitor is electrically connected to the second level signal terminal.

8. The shift register unit according to claim 2, wherein the even frame pull-down circuit comprises a first even frame pull-down transistor, a second even frame pull-down transistor, and a third even frame pull-down transistor, a gate electrode of the first even frame pull-down transistor is electrically connected to the control terminal of the even frame pull-down circuit, a first electrode of the first even frame pull-down transistor is electrically connected to the signal output terminal, and a second electrode of the first even frame pull-down transistor is electrically connected to the second level signal terminal;
a gate electrode of the second even frame pull-down transistor is electrically connected to the control terminal of the even frame pull-down circuit, a first electrode of the second even frame pull-down transistor is electrically connected to the control terminal of the pull-up circuit, and a second electrode of the second even frame pull-down transistor is electrically connected to the second level signal terminal, and
a gate electrode of the third even frame pull-down transistor is electrically connected to the control terminal of the pull-up circuit, a first electrode of the third even frame pull-down transistor is electrically connected to the second level signal terminal, and a second electrode of the third even frame pull-down transistor is electrically connected to the control terminal of the even frame pull-down circuit.

9. The shift register unit according to claim 8, wherein the even frame pull-down circuit further comprises a second storage capacitor, a first end of the second storage capacitor is electrically connected to the control terminal of the even frame pull-down circuit, and a second end of the second storage capacitor is electrically connected to the second level signal terminal.

10. The shift register unit according to claim 3, wherein the input circuit comprises a forward input circuit and an inverse input circuit, the shift register unit comprises a forward signal terminal and an inverse signal terminal, the trigger signal input terminal comprises a forward trigger signal input terminal and an inverse trigger signal input terminal, the pull-down control sub-circuit comprises a forward pull-down control sub-circuit and an inverse pull-down control sub-circuit, a control terminal of the forward input circuit is electrically connected to the forward trigger signal input terminal, an input terminal of the forward input circuit is electrically connected to the forward signal terminal, and an output terminal of the forward input circuit is electrically connected to the output terminal of the input circuit, a control terminal of the inverse input circuit is electrically connected to the inverse trigger signal input terminal, an input terminal of the inverse input circuit is electrically connected to the inverse signal terminal, and an output terminal of the inverse input circuit is electrically connected to the control terminal of the pull-up circuit, a control terminal of the forward pull-down control sub-circuit is electrically connected to the forward signal terminal, an input terminal of the forward pull-down control sub-circuit is electrically connected to a second clock signal terminal, and an output terminal of the forward pull-down control sub-circuit is electrically connected to an output terminal of the inverse pull-down control sub-circuit, and electrically connected to the first input terminal of the odd frame trigger sub-circuit and the first input terminal of the even frame trigger sub-circuit, and a control terminal of the inverse pull-down control sub-circuit is electrically connected to the inverse signal terminal, an input terminal of the inverse pull-down control sub-circuit is electrically connected to a fourth clock signal terminal, and the output terminal of the inverse pull-down control sub-circuit is electrically connected to the output terminal of the forward pull-down control sub-circuit.

11. The shift register unit according to claim 10, wherein the forward input circuit is configured to electrically connect the input terminal of the forward input circuit to the output terminal of the forward input circuit when the control terminal of the forward input circuit receives an active signal, the inverse input circuit is configured to electrically connect the input terminal of the inverse input circuit to the output terminal of the inverse input circuit when the control terminal of the inverse input circuit receives an active signal, the forward pull-down control sub-circuit is configured to output an active signal provided by the forward signal terminal when the forward signal terminal provides the active signal and the inverse signal terminal provides an inactive signal, and the inverse pull-down control sub-circuit is configured to output an active signal provided by the inverse signal terminal when the forward signal terminal provides an inactive signal and the inverse signal terminal provides the active signal.

12. The shift register unit according to claim 11, wherein the forward input circuit comprises a forward input transistor, a gate electrode of the forward input transistor is electrically connected to the control terminal of the forward input circuit, a first electrode of the forward input transistor is electrically connected to the input terminal of the forward input circuit, and a second electrode of the forward input transistor is electrically connected to the output terminal of the forward input circuit.

13. The shift register unit according to claim 11, wherein the inverse input circuit comprises an inverse input transistor, a gate electrode of the inverse input transistor is electrically connected to the control terminal of the inverse input circuit, a first electrode of the inverse input transistor is electrically connected to the input terminal of the inverse input circuit, and a second electrode of the inverse input transistor is electrically connected to the output terminal of the inverse input circuit.

14. The shift register unit according to claim 11, wherein the forward pull-down control sub-circuit comprises a first forward pull-down control transistor and a second forward pull-down control transistor, a gate electrode of the first forward pull-down control transistor is electrically connected to the control terminal of the forward pull-down control sub-circuit, a first electrode of the first forward pull-down control transistor is electrically connected to the second clock signal terminal, and a second electrode of the first forward pull-down control transistor is electrically connected to a gate electrode of the second forward pull-down control transistor, and a first electrode of the second forward pull-down control transistor is electrically connected to the second clock signal terminal, and a second electrode of the second forward pull-down control transistor is electrically connected to the output terminal of the forward pull-down control sub-circuit.

15. The shift register unit according to claim 11, wherein the inverse pull-down control sub-circuit comprises a first inverse pull-down control transistor and a second inverse pull-down control transistor, a gate electrode of the first inverse pull-down control transistor is electrically connected to the inverse signal terminal, a first electrode of the first inverse pull-down control transistor is electrically connected to the fourth clock signal terminal, and a second electrode of the first inverse pull-down control transistor is electrically connected to a gate electrode of the second inverse pull-down control transistor, and a first electrode of the second inverse pull-down control transistor is electrically connected to the fourth clock signal terminal, and a second electrode of the second inverse pull-down control transistor is electrically connected to the output terminal of the inverse pull-down control sub-circuit.

16. The shift register unit according to claim 1, wherein the pull-up circuit comprises a pull-up transistor and a third storage capacitor, and the initial signal terminal comprises a first clock signal terminal, a gate electrode of the pull-up transistor is electrically connected to a control terminal of the pull-up circuit, a first electrode of the pull-up transistor is electrically connected to the first clock signal terminal, and a second electrode of the pull-up transistor is electrically connected to the signal output terminal, and a first end of the third storage capacitor is electrically connected to the gate electrode of the pull-up transistor, and a second end of the third storage capacitor is electrically connected to the signal output terminal.

17. A shift register, comprising a plurality of cascaded shift register units, wherein each of the plurality of shift register units is the shift register unit according to claim 1.

18. A gate driving circuit, comprising a shift register and a frame signal determination unit, the shift register being the shift register according to claim 17, and the frame signal determination unit being configured to output a frame trigger signal indicating a sequence number of a frame to the shift register unit.

19. A display panel, comprising a gate driving circuit, wherein the gate driving circuit is the gate driving circuit according to claim 18.

\* \* \* \* \*